Dec. 20, 1960 G. A. KWASNIEWSKI ET AL 2,964,749

ATTACHING ELECTRICAL COMPONENTS

Filed June 15, 1955 3 Sheets-Sheet 1

INVENTORS
George A. Kwasniewski
Raymond S. Karinen
By William C. Stueber
ATTORNEY Dec. 20, 1960 G. A. KWASNIEWSKI ET AL 2,964,749

ATTACHING ELECTRICAL COMPONENTS

Filed June 15, 1955 3 Sheets-Sheet 2

INVENTORS
George A. Kwasniewski
Raymond S. Karinen
By William C. Stueber
ATTORNEY

ATTACHING ELECTRICAL COMPONENTS

INVENTOR.

George A. Kwasniewski
Raymond S. Karinen
By William C. Stueber
Attorney 2,964,749

ATTACHING ELECTRICAL COMPONENTS

George A. Kwasniewski, Minneapolis, and Raymond S. Karinen, St. Paul, Minn., assignors to General Mills, Inc., a corporation of Delaware Filed June 15, 1955, Ser. No. 515,742

12 Claims. (Cl. 1—2)

The present invention relates to an improved method of attaching electrical components to a circuit board and to apparatus for performing the attachment.

Many improvements in the art of assembling electrical components and in electrical structure in the electronic field have adopted the printed circuit board, which is econoimcal and is susceptible of being mass produced. These boards are usually formed of an insulating material having electrical conductors embedded or printed on the surface, and electrical components are attached between the ends of the conductors to complete the assembly of the circuit board and obtain an operative circuit.

In attaching components to these boards, the component leads are frequently projected through holes in the boards with the leads being attached to the conductors on the board such as by soldering. The connections between these component leads and the conducting material on occasion became defective by the soldered joint being imperfect or being broken by jarring during handling or during operation. A poor or broken electrical circuit results with the consequent failure of operation of the entire circuit and the necessity of locating the joint and making a repair.

The present invention contemplates improving the connection between the leads of the components and the conducting material in the circuit board and providing an improved method and apparatus for obtaining the improved connection.

It is accordingly an objective of the present invention to provide an improved method of connecting the leads of an electrical component to a printed circuit board in such a manner that the connection will have improved electrical properties and increased rigidity and stability so as to diminish the chances of the electrical circuit being broken due to jarring, aging of the equipment, and the like.

Another objective of the invention is to provide an improved apparatus for connecting component leads to the conducting portion of a circuit board which is positive in operation and is especially adaptable to use with automatic machinery which continuously and automatically attaches a plurality of electrical components to a series of consecutive circuit boards which are moved through a machine.

A further object of the invention is to provide an apparatus which will crimp the leads of an electrical component which project through a circuit board in the direction of the conducting material which is on the surface of the circuit board so that the leads will form line contact with the conducting material for the full length of the crimped end.

A further object of the invention is to provide an automatic machine which will bend over or crimp the ends of the leads of an electrical component attached to a printed circuit board and in which the direction that the individual leads are bent is independently adjustable with a minimum of effort and without altering the operation of the working parts of the machine.

Other objects and advantages will become more apparent in the following specification taken in connection with the appended drawings in which.

In the over-all operation of the mechanism, electrical components such as resistors, condensers, transformers, transistors, and the like are attached to circuit boards. These boards are formed of thin insulating material which carry printed circuits. The printed circuit boards, as they are to be generally referred to herein may have the circuit printed on the surface or they may have the circuit molded or embedded in the board, sprayed on the surface, or manufactured by any of the techniques known to the art. The circuits are formed by strips of conducting material leading across the board and terminating at holes in the board. The leads of the electrical components are then inserted in the holes so that the component completes the circuit between the ends of the conducting strips with electrical current passing along the conducting strip, through the lead inserted in the hole, through the component, through the lead at the other end of the component, and to the next conducting strip.

The leads, after being inserted in the holes, are generally soldered at their ends to the conducting strips, and this may be done either by hand or soldering iron or dip soldering wherein the entire circuit board is dipped in a pool of molten solder with the solder adhering to the leads and conducting strip but not adhering to the insulating material of the board.

Figures 6, 7, 8:
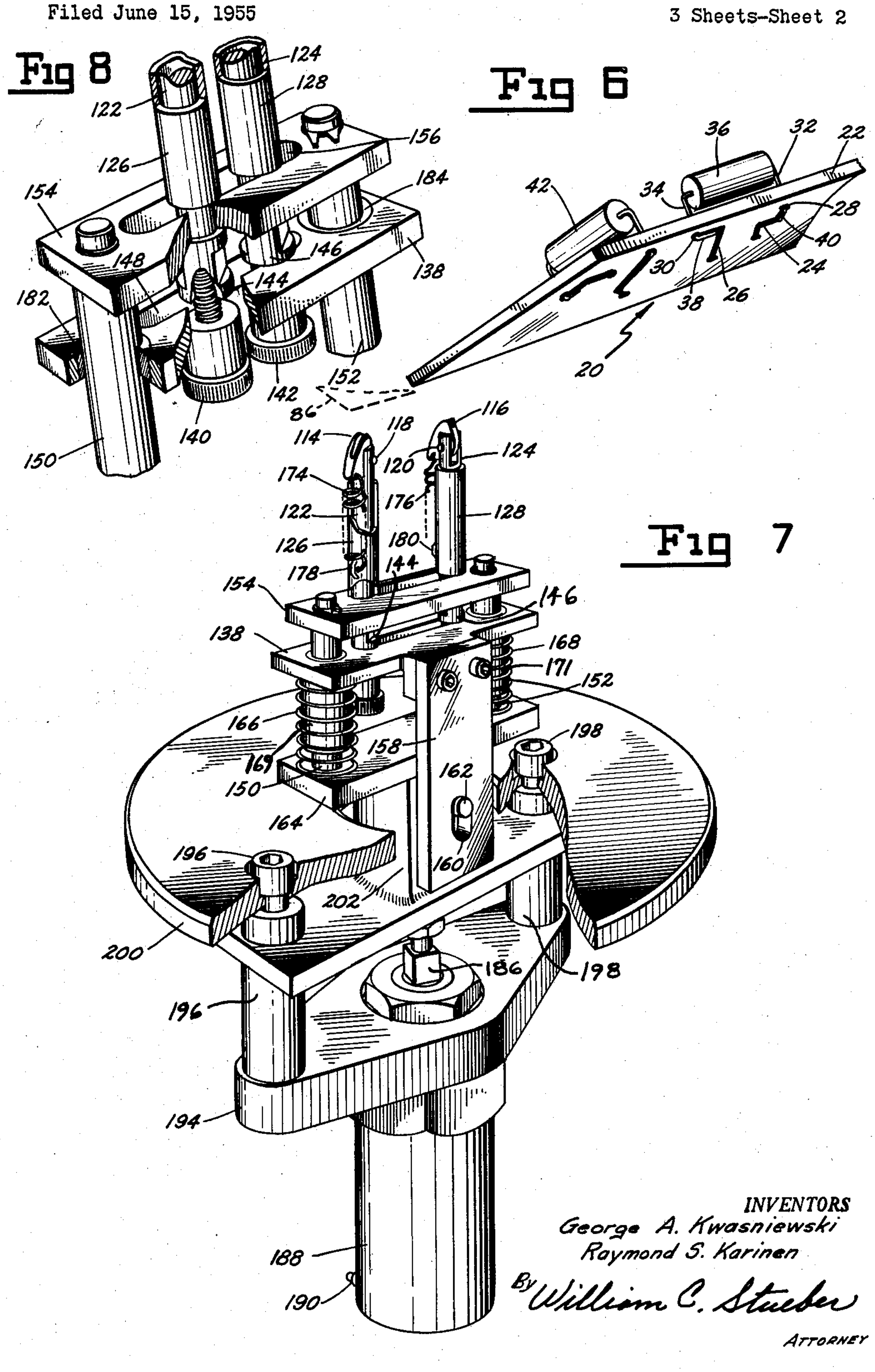
Fig. 6 is a perspective view of a portion of the circuit board showing the electrical components attached and the leads crimped.
Fig. 7 is a perspective view of the crimping mechanism assembly.
Fig. 8 is a detailed perspective view illustrating the arrangement of the mechanism for adjusting the spacing between the lead crimping members.

A portion of the conduit board with the component attached is illustrated in Fig. 6, shown generally at 20. The insulating board material 22 contains the conducting strips 24 and 26 which terminate in holes 28 and 30 on the board. Through these holes are inserted the leads 32 and 34 of the electrical component 36.

It will be seen from this illustration of Fig. 6 that the conducting strips extend from the holes in different directions. This is due to the different conducting strips leading away from the holes to different locations on the board and also due to the necessity of placing a large number of conducting strips on the boards and keeping them separated as much as possible to avoid arcing and minimize the effects of inductance. Although only a few conducting strips are shown in the illustration of Fig. 6, a complex circuit board will carry many more strips. Only a few strips are shown in the drawing for purposes of simplicity.

As is the case with a large number of circuit boards the conducting strips are exposed at the surface of the circuit boards. This type of board is easy to manufacture and the conductors are exposed for ease of soldering to the component leads.

The present invention contemplates attaching the components by projecting the leads through the board a substantial distance and bending the ends of the leads over in the direction in which the conducting strip extends. For example, in Fig. 6 the lower end 38 of the lead 34 is bent parallel to the conducting strip 26 so that it will lie parallel to and in the center of the conducting strip to contact the conducting strip over the entire length of the end of the lead and will form line contact therewith. Thus, when the board is soldered, a soldered bridge will be formed over the entire length of the crimped end 38 of the lead and a very secure joint will be made. The resulting joint will be good from an electrical conduction standpoint and will also be very satisfactory from a physical standpoint since jarring and shocking of the board will not tend to break the contact between the conducting strip and the crimped end of the lead.

The same arrangement is found in the lower end 40 of the lead 32. This lower end is bent parallel to the conducting strip 24 which extends away from the hole 28 of the board in a direction different from the conducting strip 26.

Thus, although the conducting strips extend in different directions, the leads are also crimped in different directions, each being crimped parallel to the direction in which the conducting area extends. The same arrangement is followed for the other components on the board, such as illustrated by the component 42.

Turning now to the mechanism and method of attaching the component to the board to obtain the structure above described, the operating mechanism may, for purposes of description, be divided into two operations. The first operation consists of bending the leads of the component toward the circuit board in preparation for attaching and inserting them into the holes in the circuit board. The second operation consists of crimping or bending the leads beneath the board.

Figures 1, 3:
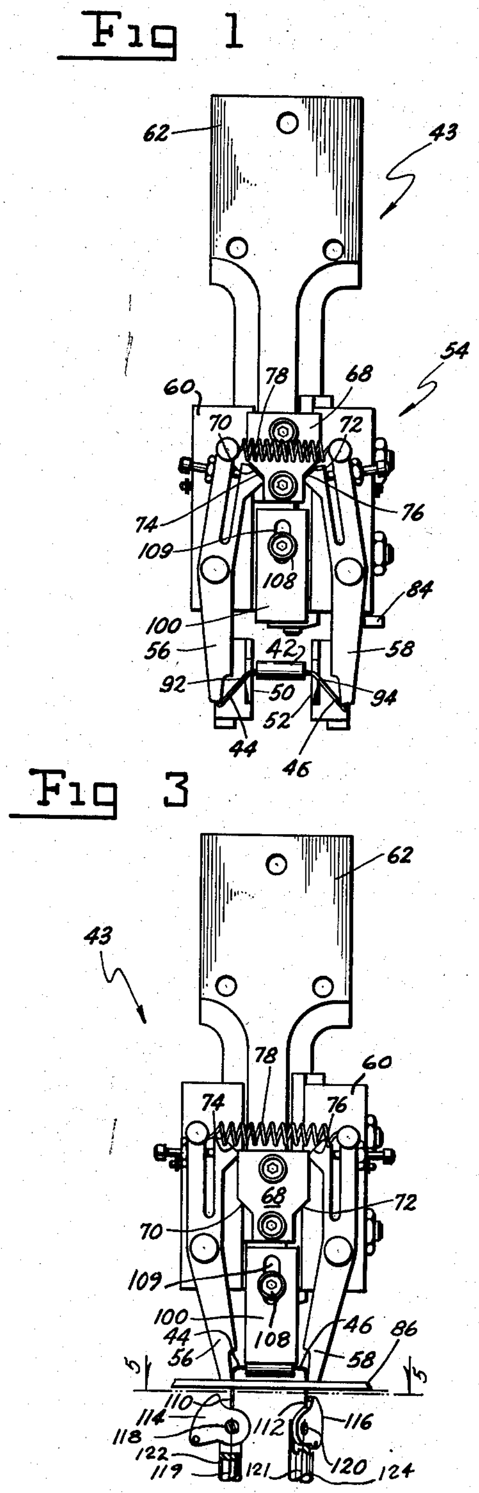
Figure 1 is a front elevation of mechanism for supporting an electrical component and bending the leads downwardly toward the circuit board prior to inserting them into the board.
Fig. 3 is another view of the mechanism of Figs. 1 and 2 illustrating the component leads inserted through the circuit board.
Figure 2:
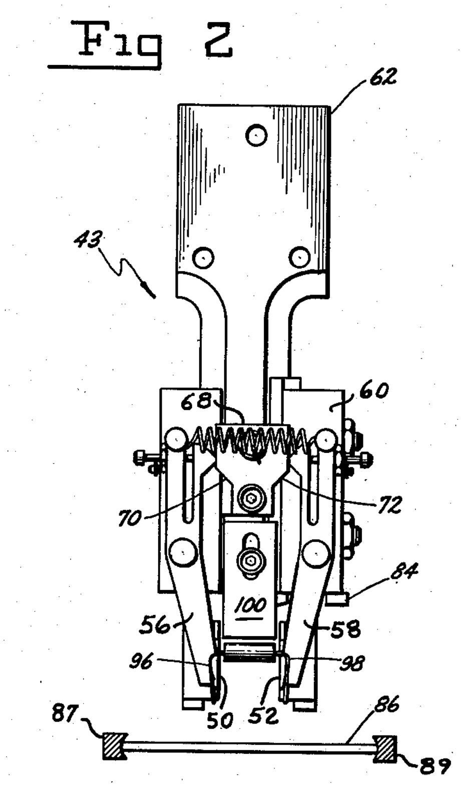
Fig. 2 is another view of the bending mechanism of Fig. 1 showing the component leads having been bent.

In Figs. 1 to 3 the overall inserter mechanism is shown generally at 43 for bending the leads 44 and 46 of the component 42. For this operation the component is supported by its leads on anvil fingers 50 and 52 which project beneath the assembled bending mechanism shown at 54. The bending mechanism utilizes a pair of bending fingers 56 and 58 which function to move against the component leads to bend them downwardly and then move together to force the leads against the side walls of the anvil fingers 50 and 52.

After the bending fingers have bent the leads downwardly toward the circuit board to the position of Fig. 2, the anvil fingers 50 and 52 are moved out of the way and the bending fingers then carry the component downwardly to insert the bent leads into the holes in the circuit board in the manner illustrated in Fig. 3 as will be later described in detail. Thus the bending fingers also function to serve as inserting fingers and will further aid the operation, performing as holding fingers to maintain the position of the component while the ends of the leads are being crimped beneath the circuit board.

As illustrated in Figs. 1, 2 and 3 the bending fingers are pivotally mounted on a tool holder 60. This tool holder 60 is slidably supported on a tool slide 62. The tool holder 60 is slidably mounted on the tool slide 62 and its vertical sliding movement relative thereto is limited, so it cannot slide off the tool slide. The sliding movement is also controlled and this movement operates the lead bending fingers 56 and 58.

Secured to the face of the tool slide 62 is a finger operating cam 68. This cam functions to move the lower ends of the fingers together to bend the component leads against the side of the anvil fingers 50 and 52.

As may be seen in Fig. 1, the finger operating cam 68 has a pair of cam surfaces 70 and 72 against which ride the upper ends 74 and 76 of the lead bending fingers. The upper ends of the fingers are pulled together and held in engagement with the cam by a tension spring 78, which tends to pivot the fingers to cause the lower ends to spread apart.

In the operation of the machine, the inserting member 62 is lowered to cause the bending fingers to descend on the component leads 44 and 46. The inserting member may be attached to an operating mechanism such as pneumatic piston or the like which will give it its vertical reciprocating motion. As the inserting member is lowered, the finger carrying member 60 engages a temporary stop 84. This stop 84 causes the finger carrying member to slide upwardly on the inserting member, which continues its downward movement.

As will be noted in Fig. 2, when the finger carrying member slides upwardly on the inserting member, the upward ends 74 and 76 of the fingers move apart since they slide upwardly on the cam shoulders 70 and 72. This brings the lower end of the fingers 56 and 58 together to bend the ends of the component leads 44 and 46 downwardly against the side faces of the anvil fingers 50 and 52. In this position the ends of the leads project downwardly toward the circuit board 86, which is shown supported by guides 87 and 89.

At this point in the operation, the anvil fingers 50 and 52 and the stop member 84 are moved out of the way of the descending inserter 43. With these members removed the inserting member 62 can continue its downward movement and the bending fingers 56 and 58 will continue to hold the component between them.

It will be noted that the bending fingers bulge outwardly at 92 and 94, to form ridges which are located directly beneath the component leads so that as the lead is bent downwardly, it will bulge outwardly over the ridge. This bulge, as shown at 96 and 98 in Fig. 2, projects into a cavity in each of the bending fingers so that the component leads may be firmly grasped by the fingers and cannot slide out from between the fingers when the anvil fingers are removed.

After the anvil fingers 50 and 52 are moved out of the way, the inserter 62 continues its downward descent and, as shown in Fig. 3, inserts the ends of the leads 44 and 46 into the holes in the circuit board 86.

The circuit board is suitably supported in a position beneath the inserting mechanism and is positioned so that the holes in the board will receive the component leads as they are moved downwardly. As illustrated, the board is held between guide rails 87 and 89. These rails may extend to additional heads for carrying the board to receive additional components.

To steady the component as it is held between the fingers 56 and 58 and force it against the circuit board, a component body engaging pusher 100 pushes on the component body 42. This pusher member is secured to the inserter member 62 by the bolt 108 which passes through the slot 109 so as to enable vertical adjustment of the pusher.

While the component is held between the bending fingers 56 and 58 and steadied by the pusher member 100 as shown in Fig. 3, the ends 110 and 112 of the leads which project beyond the lower surface of the circuit board are bent upwardly against the lower surface of the circuit board.

Figure 4:
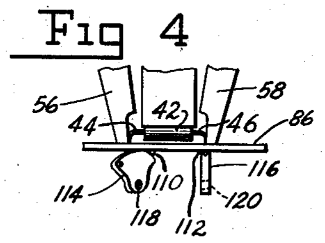
Fig. 4 is a front elevational view illustrating the leads being crimped or bent beneath the circuit board.

This bending operation is illustrated in Fig. 4. Although the ends of the leads are bent simultaneously, they are bent individually in that they are bent in their individual directions as determined by the direction in which the conducting material extends away from the component lead. As illustrated in Figs. 3 and 4, the bending members are shown at 114 and 116 and are pivotally mounted to pivot about their axes 118 and 120. From the position in Fig. 7 where they are spaced a distance below the board, they are moved up to the position illustrated in Figs. 3 and 10 adjacent the leads. They are then pivoted about their pivotal points 118 and 120 to engage the leads and force them against the underside of the circuit board. This operation will be better understood in connection with Figs. 7 through 11 which illustrate the details of the mechanism for bending or crimping the lower ends of the component leads.

In Fig. 7, the crimping fingers 114 and 116 are shown in their lowered position wherein they are spaced below the circuit board. The crimping fingers must be raised to a position adjacent the board for bending the leads of the component each time a new component is inserted into a board. A new insertion may occur with the board being repositioned and a new component inserted into the board or it may occur by inserting a new component into a new circuit board as is the case when the mechanism is used in an automatic machine wherein a series of boards are carried by a conveyor past the inserting and crimping mechanism. With each new board a fresh component is brought down and inserted into the holes in the board and the crimping operation is then performed. As the crimping members 114 and 116 are moved downwardly away from the board, it will be moved on to a new location and a succeeding board brought into place. Thus a series of crimping and inserting mechanisms may be positioned at a number of stations along a conveyor with a separate component being inserted into the board at each station. Since, as it will be noted from the following description, the crimping mechanism is shown operated by an air cylinder, a series of mechanisms may be operated simultaneously by being connected to the same air line and with an automatic machine, a conveyor can be arranged to have a board positioned and ready at each of the stations for each operation of the crimping mechanism.

Turning now to the details of construction and the operation of the crimping mechanism, the crimping fingers 114 and 116, as was previously described, are mounted to swing pivotally about their support pins 118 and 120. As shown in Fig. 7, the pivotal fingers are supported between the upper bifurcated ends of support rods 122 and 124. The rods are preferably round and are mounted for rotational adjustment so that they may be set to any rotational position. It will thus be seen that the direction in which the finger moves when it swings upwardly about the pivotal pin will be determined by the rotational position of its supporting rod.

Figure 5:
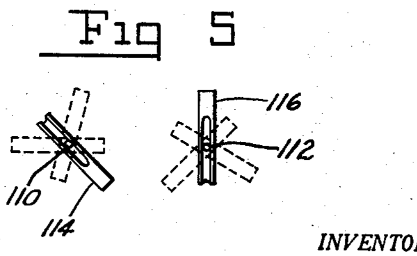
Fig. 5 is a sectional view taken along line 5—5 of Fig. 3.

As is illustrated in Fig. 5 by the solid line and the dotted line positions of the crimpers, the crimpers 114 and 116 may be swung to numerous operating positions about the axis of their supporting rods. It is important, however, that the center line of the support rods 122 and 124 be positioned so that they are coaxial with the leads as they project downwardly. Thus as is illustrated in Fig. 3, the axes 119 and 121 of the rods are co-extensive with the projecting ends 110 and 112 of the bent leads 44 and 46. With this positioning the rods may be rotated and the crimping fingers will always engage the leads properly for crimping although they may engage the leads from different directions.

The crimping fingers 114 and 116 are caused to swing upwardly at the appropriate time by sleeves 126 and 128 which surround the support rods and are coaxial therewith. When the sleeves are slid upwardly on the rods, their upper edges 130 push on a shoulder 132 on the finger 133 as will be illustrated in the detail drawing of Fig. 9. The sleeve of this figure has been slid upwardly and the finger 136 is in the lead crimping position. It will also been from Fig. 9 and from Figs. 7, 10, and 11 that no matter what the rotational position of the supporting rods 122, 124 or 131, since the upper edge 130, Fig. 9 of the sleeve extends annularly completely around the rod 131, it will always be in a position to operate the crimping finger.

Figures 9, 10, 11:
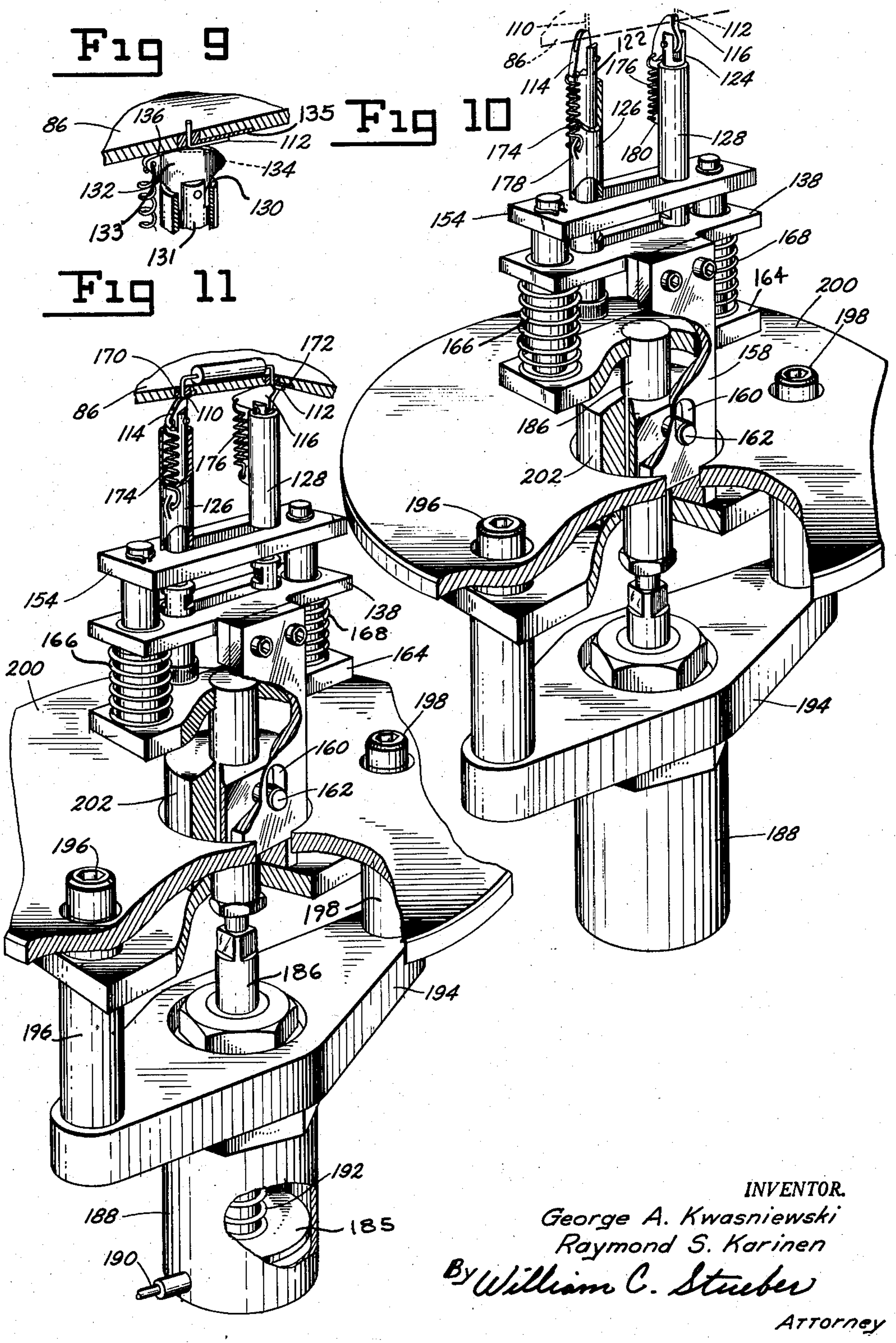
Fig. 9 is a detailed enlarged perspective view with portions broken away, illustrating the details of one of the lead crimpers.
Fig. 10 is another perspective view of the crimping mechanism assembly of Fig. 7 illustrating the relative position of the parts after the bending members have been raised beneath the circuit board.
Fig. 11 is another perspective view of the crimping mechanism assembly illustrating the relative position of the parts as the leads are being crimped.

It will be seen from Fig. 9 that a groove 134 is cut in the upper curved edge 136 of the crimping finger. This groove is of a depth to accommodate the end 112 of the lead so that it cannot accidentally slip to one side of the crimping finger but will be positively bent against the exposed conducting strip on the bottom of the circuit board. The crimping finger is shaped so that it will sharply bend the end 112 of the lead against the lower edge of the board and so that it will lie flat against the conducting strip 135, Fig. 9, over its entire length and the crimping finger presses the lead against the strip with a smoothing action for a considerable portion of its movement to insure a complete and positive bending and positive engagement between the lead and strip.

The rotational adjustment of the position of the rods 122 and 128, as previously discussed, determines the direction in which the crimping members will swing upwardly against the ends of the component leads. This adjusted position is set according to the direction in which the conducting strip extends away from the lead as was described in connection with Fig. 6.

To maintain the adjusted rotational position, the rods are clamped to a slotted plate 138 as shown in detail in Fig. 8. The lower end of each of the rods carries an enlarged end 140 and 142 having a knurled flange and which allows for manually rotating the rod to its adjusted pos.tion. To secure the rod in its adjusted position, it carries a threaded nut 144 or 146. When the rod has been rotated to the proper adjusted position, the threaded nut 144 is turned down tightly on the top of the rod supporting plate 138, drawing the enlarged ends 140 and 142 of the rod up against the rod supporting plate 138, and the plate is clamped between the nuts 144 and 146 and the enlarged ends 140 and 142.

It is to be further noted that the rods pass through an elongated slot 148 in the rod-supporting plate 138. This elongated slot permits a lateral as well as a rotational adjustment of the rods 122 and 124. Thus when the nuts 144 and 146 are loosened, the rods can be moved laterally to determine the spacing between the crimping fingers 114 and 116. This adjustment may also be used to determine the individual positions of the crimping fingers and will aid in adjusting the position of the rods 122 and 124 so that they are coaxial with the leads.

As will also be noted from Fig. 8, a pair of lifting shafts 150 and 152 slidably project through the rod adjustment plate 138. The lower ends of the lifting shafts are secured to the lifting plate 164. The upper ends of these shafts are fixed to a sleeve operating plate 154. This sleeve operating plate 154 also has an elongated slot 156 to accommodate lateral adjustment of the individual finger supporting rods 122 and 124. The slot 156 is large enough to permit the rods to pass through but is of a width so that the sleeves 126 and 128 rest on its upper surface. Thus vertical movement of the sleeve plate 154 will push upwardly on the sleeves 126 and 128 but not on the rods 122 and 124. This upward movement of the sleeves, as will be understood from previous discussion, causes the crimping fingers to pivot upwardly to bend the projecting ends of the leads against the lower surface of the circuit board.

Of course, when the rods 122 and 124 are lifted upwardly with the sleeves 126 and 128 there is no relative movement between them and the crimping fingers will not be pivoted. To lift the rods when the crimping fingers are first being moved up into position beneath the circuit board, lifting springs 166 and 168 are positioned between the lifting plate 164 and the rod supporting plate 138.

Thus with reference to Figs. 7 and 8 the lifting plate 164 is first lifted to raise the lifting rods 150 and 152 and the rod supporting plate 138 and the entire assembly toward the circuit board to position the crimping fingers adjacent the leads. After the crimping fingers have been raised to the operating position as shown in Fig. 10, the upward movement of the rod supporting plate 138 stops and the lifting plate and sleeve operating plate 154 continue to move upwardly, thus lifting the individual sleeves 126 and 128 to pivot the crimping fingers. The apparatus for obtaining this operation may be seen in Figs. 7, 10 and 11.

To stop the upward movement of the rod supporting plate when the crimping fingers are in operating position, a vertically positioned limit member 158 is secured to the side of the rod supporting plate. This limit member has a slot 160 into which projects a stop pin 162. When the rod supporting plate 138 has been raised to the position shown in Fig. 10, the fixed pin 162 has reached the bottom of the slot 160 and the upward movement of the limit member 158 and the rod supporting plate 138 is stopped. The lifting plate 164 continues its upward movement to operate the crimping fingers as the springs 166 and 168 begin to compress.

When the springs 166 and 168 compress, the operating shafts 150 and 152 will continue their upward movement to raise the sleeve operating plate 154. When the sleeve operating plate continues its upward movement and the support rods 122 and 124 have stopped, the sleeves 126 and 128 will slide upward on support rods to pivot the crimping fingers. This, of course, will crimp the individual ends of the leads in the manner shown in Figs. 4 and 11, and the leads 110 and 112 are bent against the conducting strips 170 and 172.

The lifting plate continues its upward movement to operate the crimping fingers until it engages the spacers 169 and 171. The tubular spacers 169 and 171 surround the lifting shafts 150 and 152 between the rod supporting plate 138 and the lifting plate 164 and are shorter than the space between the plates before the lifting plate is raised. When the upward movement of the rod supporting plate 138 is stopped by the pin 162 striking the bottom of the slot 160, as occurs in Fig. 10, the springs 166 and 168 begin to compress until the lifting plate 164 strikes the spacers 169 and 171.

After the leads have been crimped, the lifting plate 164 again is dropped to the original position of Fig. 7. As the bar begins dropping the rod supporting plate 138 will remain in its up position with the pin 162 at the bottom of the slot 160 because the springs 166 and 168 remain under compression to force it upwardly. The sleeve operating plate 154 will first move downwardly to permit the sleeves 126 and 128 to move downwardly on the support rods. To insure that the crimping fingers will pivot back to the return positions, a pair of tension springs 174 and 176 are provided which are connected between brackets 178 and 180 on the sleeve, Figs. 7 and 10, and the crimping fingers 114 and 116.

When the lifting plate 164 is dropped a distance so that the sleeve operating plate 154 rests on the top of the adjusting nuts 144 and 146, the rod support plate 138 will begin to move downwardly. The continued downward movement of the lifter plate 164 will bring the rod support plate 138 and its attached limit plate 158 down until the pin 162 reaches the top of the slot 160 when the downward movement of the entire apparatus will halt.

Operation of the crimping mechanism and vertical reciprocation of the lifting plate 164 is obtained from a pneumatic cylinder 188. A piston 185 operates in a cylinder 188 and has a piston rod 186 which connects to the lifting plate 164. The cylinder is connected at its lower end to an air line 190 which is supplied with pressurized air when the piston is to be raised to thereby raise the piston rod 186 and the crimping assembly. As is illustrated in Fig. 11, the piston has a spring return 192 so that when the line 190 is vented the mechanism will be returned to its lowered position. The piston is supported from a yoke 194 which is connected at its ends by bolts 196 and 198 to a frame piece 200. Also secured to this frame piece is a bearing member 202 through which the piston rod 186 slides. This fixed bearing also supports the stop pin 162 which limits the up and down movement of the rod supporting plate 138.

As was previously stated the crimping fingers work equally well regardless of their adjusted rotatable position. This is obtained by positioning the supporting rods 122 and 124 so that they are each coaxial with the component leads 44 and 46 and this arrangement is illustrated in Figs. 3 and 5. Thus it will be seen in Fig. 5 that the crimping finger 116, whether it be in the solid line position of Fig. 5 or the dotted line position 116A or the dotted line position 116B or any of the positions between these, will have the same degree of pivotal movement in performing its crimping operation.

It will thus be seen that I have provided an improved method of attaching electrical components to a circuit board wherein the ends of the leads project through the circuit board and are crimped in the direction in which the conducting strip extends. By this method the structure obtained provides improved electrical conducting properties and a durable and rigid structure which is not easily damaged by handling or by rough operation.

The mechanism provided for performing the crimping operation is extremely adaptable in that it can be easily and readily adjustable to accommodate leads which are spaced various distances apart. The same adjustment procedure is used to adjust the direction in which the crimping fingers crimp and both of these adjustments can be made without changing the parts of the machine and without affecting its performance.

As will be seen the mechanism illustrated in the preferred embodiment is rugged and consists of few parts. The adjustments which must be made are few and not precise, which enables the machine to be used continually for long uninterrupted runs or to be quickly adjusted for short runs.

We have, in the drawings and specification, presented a detailed disclosure of the preferred embodiment of our invention. It is to be understood that the invention is susceptible of modifications, structural changes and various applications of use within the spirit and scope of the invention and we do not intend to limit the invention to the specific form disclosed but intend to cover all modifications, changes and alternative constructions and methods falling within the scope of the principles taught by our invention.

We claim as our invention:

1. A mechanism for attaching electrical components to a circuit board comprising means for supporting the circuit board in attaching position with the board having component leads projecting therefrom and having exposed conducting areas extending away from the leads to join the circuit, a bending member positionable adjacent the lead and adapted to move radially of the lead and thereby bend the lead against the board, means for adjusting the starting position and the direction of radial bending movement of said bending member to position it at the side of the lead opposite said exposed conducting area so that it may bend the lead radially toward said area, and means to move the bending member radially against the lead to bend it against said conducting area to form line contact therewith.

2. A mechanism for attaching electrical components to a circuit board comprising a support for a circuit board which has component leads projecting from the lower surface thereof and has strips of conducting material extending away from the leads to form part of the circuit, individual bending elements positioned beneath the leads which they are to bend, pivotal supports for the bending elements to enable them to be pivoted up against the lead to bend them against the board, a rotatable mounting for each of the bending members and pivotal supports, each of said mountings being coaxial with the component lead which it is to bend and adjustable in rotational position about its axis so that the direction in which the individual bending elements move toward the lead may be adjusted by rotating their mountings so that they can engage the lead in a direction opposite that in which the conducting strip extends, and means to pivot the bending members upwardly against the leads to force them against the conducting strips in line contact therewith.

3. A mechanism for attaching electrical components to a circuit board positioned in attaching position and having leads projecting through the board with exposed conducting areas extending away from the leads to form a portion of the circuit, a bending member located adjacent the lead and adapted to be pivoted against the lead to bend it against the circuit board, a pivotal support for the bending member, a shoulder on the bending member adjacent the pivotal support which may be engaged to pivot the lead upwardly, and means to engage said shoulder and pivot the bending member upwardly to bend the lead against the conducting strips and in line engagement therewith.

4. A mechanism for attaching electrical components to a circuit board having leads projecting therefrom and exposed conducting strips extending away from the leads, the mechanism comprising a bending member positioned adjacent the board and adapted to engage the lead and bend it against the conducting strip on the board, a pivotal support for the bending member to enable it to be pivoted against the lead, a rotatable mount for the bending member and its pivotal support, said support being adjustable in a rotational direction about an axis parallel to the projecting component lead so that the pivotal member may be moved against the lead in a direction opposite the conducting strip to bend the lead against the conducting strip, a sleeve surrounding said rotatable support and movable coaxially therewith in a linear direction, and a shoulder on the bending member engageable by said sleeve so that movement of the sleeve will cause the bending member to pivot to bend the extending lead.

5. A mechanism for attaching electrical components to a circuit board having component leads projecting therefrom and exposed conducting strips extending away from the leads, the mechanism comprising a pair of pivotally mounted bending members, support members rotatable about an axis perpendicular to the circuit board for each of the pivotal bending members, a co-axial sleeve surrounding each of the support members, a shoulder on the pivotal bending members engageable by the sleeve to pivot the bending member to bending position, a support assembly carrying said support members and movable toward or away from the board to move the fingers into lead bending position, means to move the support assembly toward the board to move the fingers into bending position, and means to move said sleeves axially along the support members toward the bending members to cause them to pivot against the component leads to bend them against the circuit board.

6. A machine for attaching electrical components to a circuit board in accordance with claim 5 in which said support members for the pivotal bending members are rotationally adjustable to individually adjust the position of the bending members so that they will move against the component leads from a direction opposite that in which the conducting strip extends so that the leads will be bent parallel to the conducting strips to form line contact therewith.

7. A mechanism for attaching electrical components to a circuit board having component leads extending therefrom and conducting areas extending away from the leads, the mechanism comprising a plurality of bending members spaced apart corresponding to the spacing of the component leads, axially movable support rods extending perpendicularly to the circuit board and pivotally supporting said bending members, a member to carry the support rods, coaxial sleeve members surrounding said axially movable support rods and movable relative thereto to engage the fingers and cause them to pivot in a lead-bending action, a sleeve-operating member operatively connected to said sleeves to move them with respect to said support rods, lifting means to raise said rod-carrying member, the sleeve-operating member, and associated mechanism toward the circuit board, and stop means to restrain the vertical action of said rod-carrying member means after said lifting means has traveled a predetermined distance and to cause said sleeve-operating member to move said sleeves axially with respect to the support members to cause the bending fingers to pivot in bending action.

8. A mechanism for attaching electrical components to a circuit board having holes for the component leads with conducting strips leading away from the holes comprising supporting means for holding said board with the ends of the leads projecting through said holes in the circuit board, a pair of lead crimping members positioned opposite the component leads which project through the circuit board, means for moving the crimping members radially of the projecting leads and against the projecting leads to bend them against the circuit board in the directions of movement of the crimping members, and means to separately adjust the direction of radial movement of the individual crimping members so that they may be adjusted to bend the leads in the direction of the conducting areas to form line contact with the conducting areas.

9. A mechanism for attaching electrical components to a circuit board comprising bending elements for bending the ends of the leads of the component at an angle to the body of the component, inserting apparatus adapted to insert the ends of the leads into holes in the circuit board, crimping fingers positioned opposite the component leads which project through the circuit board, supports for the crimping fingers which are rotationally adjustable about an axis coaxial with the projecting leads of the component, a pivotal support for the bending fingers on each of the rotatable support members so that the bending fingers may pivot against the component leads from the direction opposite the direction the conducting area extends away from the component leads, and means to pivot the bending fingers against the component leads to bend them against the conducting areas and form line contact therewith.

10. A mechanism for attaching electrical components to a circuit board having holes in the circuit board with the leads of the electrical components projecting through the holes, comprising a pair of crimping members adapted to engage the leads and bend them against the surface of the board, means to support the crimping members beneath the board, means to move the crimping members simultaneously against the leads to bend them against the board, a framework on which said support means are mounted, and an adjustable connection between the support means and said framework with the support means being individually adjustable in position to align the individual crimpers with the leads and to adjust the spacing between the crimpers to accommodate components in which the leads are spaced different distances apart.

11. In a machine for installing the leads of a component on a chassis, means movably mounted to thrust the leads endwise through the chassis, and anvil mechanism movable toward and from the chassis in time relation to said means for clinching the protruding ends of leads in selected directions, said mechanism including lead-wiping anvils each of which is movable radially in a desired direction relatively to the axis of its adjacent protruding lead to clinch one lead in selected angular relation to the other.

12. In a machine for installing the leads of a component on a chassis, means movably mounted to thrust the leads endwise through the chassis, and anvil mechanism movable toward and from the chassis for clinching the protruding ends of the leads in selected directions, said mechanism including lead wiping anvils each of which is movable radially in a desired direction relatively to the axis of its adjacent protruding lead to clinch one lead in selected angular relation to the other.

References Cited in the file of this patent

UNITED STATES PATENTS

| | | |
|---|---|---|
| 1,854,371 | Engel | Apr. 19, 1932 |
| 2,466,192 | Wood | Apr. 5, 1949 |
| 2,551,358 | Andren | May 1, 1951 |
| 2,637,096 | Luhn | May 5, 1953 |
| 2,734,150 | Beck | Feb. 7, 1956 |
| 2,746,041 | Heeley | May 22, 1956 |
| 2,758,303 | Dow et al | Aug. 14, 1956 |

FOREIGN PATENTS

| | | |
|---|---|---|
| 657,621 | Germany | Mar. 10, 1938 |